United States Patent [19]

Bode et al.

[11] Patent Number: 4,570,086

[45] Date of Patent: Feb. 11, 1986

[54] HIGH SPEED COMPLEMENTARY NOR (NAND) CIRCUIT

[75] Inventors: James W. Bode; Frank A. Montegari, both of Wappingers Falls, N.Y.

[73] Assignee: International Business Machines Corporation, Hopwell Junction, N.Y.

[21] Appl. No.: 508,308

[22] Filed: Jun. 27, 1983

[51] Int. Cl.[4] .............. H03K 19/013; H03K 19/084; H03K 17/04

[52] U.S. Cl. ................ 307/458; 307/255; 307/317 A

[58] Field of Search ............ 307/445, 456, 457, 458, 307/317 A, 255, 270; 330/263, 267, 268

[56] References Cited

U.S. PATENT DOCUMENTS

| | | | |
|---|---|---|---|
| 3,171,984 | 3/1965 | Eshelman et al. | 307/457 |
| 3,183,366 | 5/1965 | Brode | 307/255 X |
| 3,418,492 | 12/1968 | Lin | 307/457 X |
| 3,506,846 | 4/1970 | Niemann | 307/456 |
| 3,790,817 | 2/1974 | Dobkin | 307/456 |
| 3,798,471 | 3/1974 | Williams et al. | 307/255 |
| 4,253,035 | 2/1981 | Amitay | 307/270 |
| 4,458,159 | 7/1984 | Konian | 307/270 |

OTHER PUBLICATIONS

Cirovic, *Basic Electronics: Devices, Circuits, and Systems,* Reston Publishing Company, Inc., pp. 218–242, 1974.

*Primary Examiner*—John S. Heyman
*Assistant Examiner*—David R. Bertelson
*Attorney, Agent, or Firm*—Wesley DeBruin

[57] ABSTRACT

A high speed low power logic circuit, said logic circuit having at least first and second input terminals and an output terminal, said logic circuit accepting first and second binary inputs, respectively, at said first and second input terminals and providing a binary output at said output terminal, said binary output being a predetermined logical function of said first and second binary inputs, said logic circuit comprising: a first transistor, a second transistor and a first resistor serially connected between a first source of potential and a second source of potential, said first transistor being of first conductivity type and having an emitter, base and collector, said second transistor being of a second conductivity type opposite to said first conductivity type and having an emitter base and collector; a capacitor connected in parallel with said first resistor; a second resistor connected between said base of said second transistor and said second source of potential; first connections means passively connecting in common said base of said first transistor and said base of said second transistor; first and second diodes, said first and second diodes being respectively connected between one of said first and second input terminals and said first connection means; and second connection means connecting said output terminal to said collector of said first transistor and said collector of said second transistor.

1 Claim, 4 Drawing Figures

HIGH SPEED COMPLEMENTARY NOR (NAND) CIRCUIT

BACKGROUND OF THE INVENTION

1. Field of the Invention

The present invention relates to an improved high speed NOR circuit and the semiconductor integrated circuit structure thereof which lends itself to high density integration.

2. Description of the Prior Art

Many integrated semiconductor circuits for performing the NOR (NAND) binary logical function are known to the art. A number of texts have been published which disclose the circuit design and operation of binary logical circuits. For example, two such texts are (1) "Designing with TTL Integrated Circuits" by Texas Instruments Incorporated Components Group, Copyright 1971, McGraw-Hill Kogakusha Ltd., and (2) "Digital Integrated Electronics" by Herbert Taul and Donald Schilling, Copyright 1977, McGraw-Hill, Inc.

Set forth below are a number of U.S. patents and publications which disclose the fabrication and structure of binary logical circuits.

U.S. Pat. No. 3,736,477 entitled "Monolithic Semiconductor Circuit for a Logic Circuit Concept of High Packing Density" granted May 29, 1973 to Horst H. Berger et al.

U.S. Pat. No. 3,816,758 entitled "Digital Logic Circuit" granted June 11, 1974 to Horst H. Berger et al.

U.S. Pat. No. 3,956,641 entitled "Complementary Transistor Circuit for Carrying Out Boolean Functions" granted May 11, 1976 to Horst H. Berger et al.

U.S. Pat. No. 4,069,494 entitled "Inverter Circuit Arrangements" granted Jan. 17, 1978 to David L. Grundy.

U.S. Pat. No. 4,158,783 entitled "Current Hogging Injection Logic with Self-Aligned Output Transistors" granted June 19, 1979 to Horst H. Berger et al.

IBM Technical Disclosure Bulletin Publications

"High Density NOR Block" by J. Bode and F. A. Montegari, Vol. 19, No. 11, April 1977, pages 4186-7.

"Totem-Pole Logic" by R. T. Farley et al, Vol. 20, No. 9, Feb. 1978, pages 3466-7.

"Concept for High Performance Fiber-Optic Driver" by R. E. Da Costa et al, Vol. 22, No. 12, May 1980, pages 5363-4.

"NPN-PNP Inverter with Hysteresis" by F. A. Montegari, Vol. 23, No. 1, June 1980, pages 178-9.

"Complementary Schottky Current Switch" by R. J. Blumberg et al, Vol. 24, No. 1B, June 1981, pages 463-5.

"Injection Current Switch Logic" by H. H. Berger et al, Vol. 24, No. 6, November 1981, pages 3089-90.

"Complementary Current Switch" by F. A. Montegari, Vol. 25, No. 3B, August 1982, pages 1478-9.

No representation is made that the above identified patents and publications represent the only prior art or the most pertinent prior art.

SUMMARY OF THE INVENTION

A primary object of the invention is to provide an improved semiconductor integrated circuit for performing a logical binary function such as NOR, NAND or NOT (Invert).

Another object of the invention is to provide an improved integrated circuit utilizing a PNP transistor and performing a logical binary function.

Another object of the invention is to provide a logic circuit having push-pull drive, low output impedance and capable of driving highly capacitive loads, such as wiring (or metallurgy) on LSI chips.

Another object of the invention is to provide an improved NOT (or INVERTER) circuit.

A further object of the invention is a logic circuit which enhances physical cell density on the integrated circuit chip because many circuit components of a logic circuit may be contained in a common isolation area.

The invention may be summarized as a high speed logic circuit having a push-pull circuit including a first transistor of a first conductivity type, a second transistor of a second conductivity type and a resistor serially connected in a predetermined manner between a first potential source and a second potential source, a passive connection between the base of said first transistor and the base of said second transistor, a passive connection between the collector of said first transistor and the collector of said second transistor, and a capacitor shunting said resistor.

The invention may be summarized in greater detail as set-forth in the following two paragraphs.

A high speed low power logic circuit, said logic circuit having at least first and second input terminals and an output terminal, said logic circuit accepting first and second binary inputs, respectively, at said first and second input terminals and providing a binary output at said output terminal, said binary output being a predetermined logical function of said first and second binary inputs, said logic circuit comprising: a first transistor, a second transistor and a first resistor serially connected between a first source of potential and a second source of potential, said first transistor being of first conductivity type and having an emitter, base and collector, said second transistor being of a second conductivity type opposite to said first conductivity type and having an emitter base and collector; a capacitor connected in parallel with said first resistor; a second resistor connected between said base of said second transistor and said second source of potential; first connections means passively connecting in common said base of said first transistor and said base of said second transistor; first and second diodes, said first and second diodes being respectively connected between one of said first and second input terminals and said first connection means; and second connection means connecting said output terminal to said collector of said first transistor and said collector of said second transistor.

A high speed low power logic circuit as recited in the preceding paragraph, said logic circuit performing the INVERT Logic function and having only a single input terminal and associated diode.

It is to be appreciated that the logic circuit, in accordance with the invention, may be employed as a NOR circuit in positive logic ("high" level represents a binary "1") or as a NAND circuit in negative logic ("low" level represents a binary "1"). The logical expression for a NOR circuit is $\overline{Z}=A+B+C$, where Z is a binary output and A, B and C are binary inputs. The logical expression for NAND is $\overline{Z} = A \cdot B \cdot C$, where Z is a binary output and A, B and C are binary inputs.

The truth table is as follows:

| A | B | C | Z(NOR) | Z(NAND) |
|---|---|---|--------|---------|
| 0 | 0 | 0 | 1 | 1 |
| 0 | 0 | 1 | 0 | 1 |
| 0 | 1 | 0 | 0 | 1 |
| 0 | 1 | 1 | 0 | 1 |
| 1 | 0 | 0 | 0 | 1 |
| 1 | 0 | 1 | 0 | 1 |
| 1 | 1 | 0 | 0 | 1 |
| 1 | 1 | 1 | 0 | 0 |

The foregoing and other objects, features and advantages of the invention will be apparent from the following more particular description of the preferred embodiment as illustrated in the accompanying drawings.

DESCRIPTION OF THE PREFERRED EMBODIMENT

Figure 1:
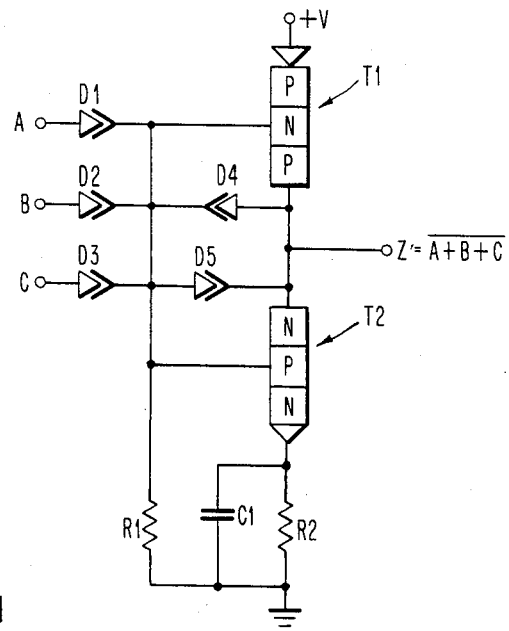
FIG. 1 is, in accordance with the invention, a circuit schematic of a NOR (NAND) gate for three binary inputs.

The high speed complementary NOR (NAND) circuit, in accordance with the invention and shown in FIG. 1, provides a push-pull logical output. The complementary NPN-PNP transistors produce the push-pull drive without the need for inverter or phase splitter pre-drivers. The resulting low impedance output of this logic circuit makes it capable of driving high capacitance metallurgy lines (or wiring) typical on LSI chips.

When inputs D1, D2 and D3 are respectively at a down level, current flows from +V through the base-collector junction of T1 into the base-collector junction of T2 and also into R1. This current turns T1 on and also keeps T2 partially on, with T2 conduction limited by emitter resistor R2. Transistor T2 thus acts as an active collector load for T1. High voltage (600 MV.) anti-saturation clamp diode D4 prevents saturation of T1.

When an up-going transition appears at one of the inputs D1, D2 or D3, current flows through D1, D2 or D3 into the base-emitter junction of T2 and into R1. Excess T2 base current flows into low voltage (300 MV.) anti-saturation clamp diode D5. The voltage level at the base of T1 is now positive enough to turn T1 off. During the positive input transition, emitter bypass capacitor C1 appears as a low impedance in the emitter circuit of T2, enhancing turn on of T2 to provide a fast down-going transition at the output node (Z). After the transition has completed the impedance in the emitter circuit of T2 increases to the value of R2 as C1 becomes fully charged. This reduces power dissipation in the quiescent state.

Input diodes D1, D2 and D3 are preferably low voltage (300 mv) Schottky barrier diodes. The low voltage characteristic is desirable to provide adequate up level noise tolerance. Anti-saturation clamp diode D4 is preferably a high voltage (600 mv) Schottky barrier diode to prevent saturation of T1. D4 also functions to produce a low T1 Vce resulting in a good up level at the output (Z).

Anti-saturation clamp diode D5 is preferably a low voltage (300 mv) Schottky barrier diode. The use of this diode as an anti-saturation clamp produces a higher Vce than a high voltage diode would produce. The high T2 Vce is a desirable feature in this case since the circuit threshold is closer to +V than to ground. The higher (500 mv) T2 Vce will therefore reduce the total output transition and improve performance.

Figure 2:
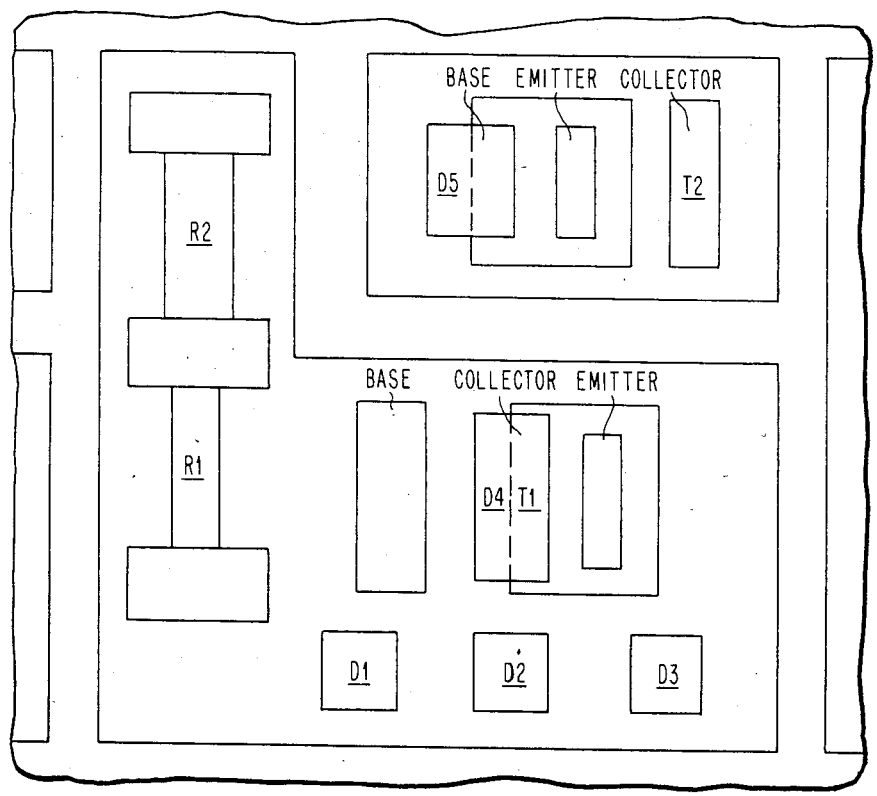
FIG. 2 is, in accordance with the invention, a planar view of a cell of a semiconductor chip. The cell of FIG. 2 includes the components required for interconnection to provide the circuit of FIG. 1.
Figure 3:
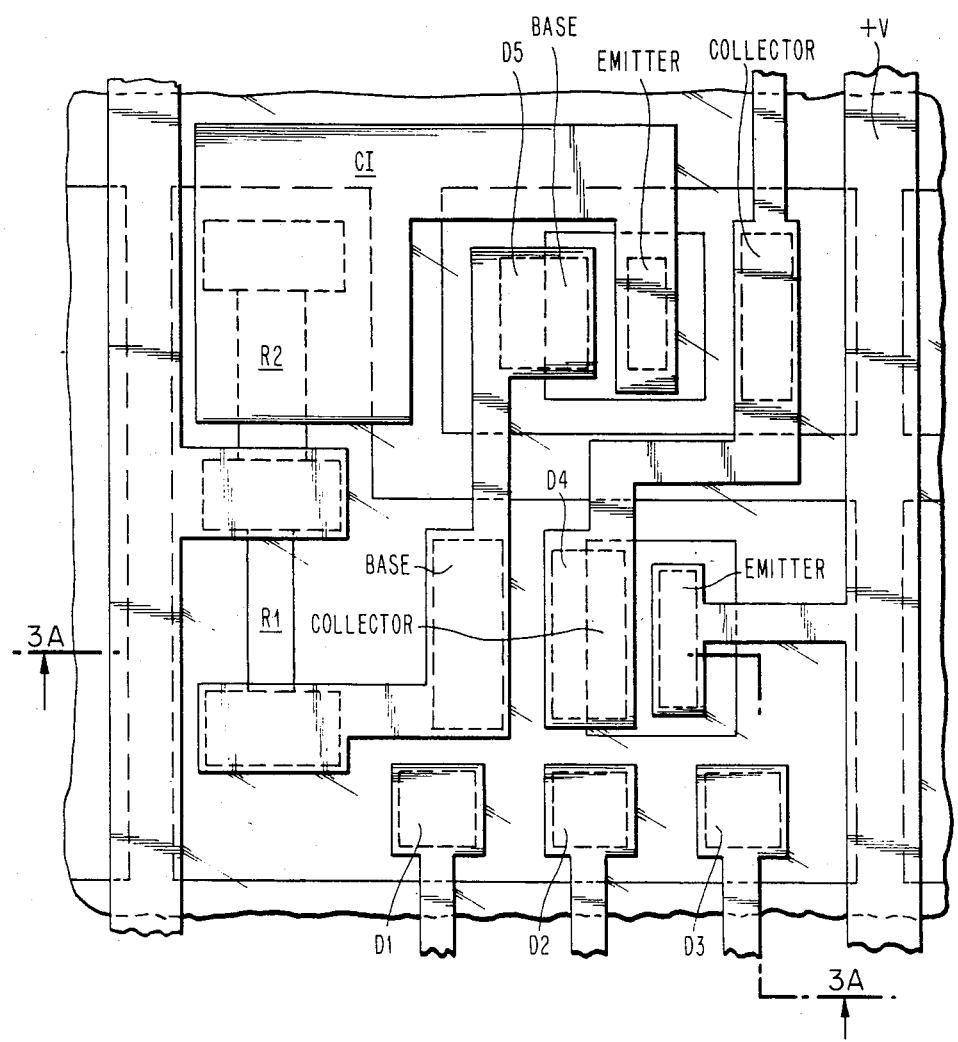
FIG. 3 is, in accordance with the invention, a planar view of the cell of the semiconductor chip depicted in FIG. 2 with interconnection metallurgy (or wiring) shown thereon.

Physical cell, FIGS. 2 and 3, density is high because many circuit components are contained in common isolation areas. Diodes D1, D2, D3 and D4 are all formed by placing known suitable metal contacts over a common N epitaxial area which is also common to the base region of T1. NPN transistor T2 is in a separate isolated bed with integrated Schottky diode D5.

Capacitor C1 is fabricated by placing a long, wide strip of first-level metal over the P diffusion of R2 and connecting one end of the metal to the T2 emitter contact end of R2.

The logic circuit in accordance with the invention makes very efficient use of chip area by eliminating the need for isolation between many of the components within a cell. This produces very high cell density, one of the requirements of Large Scale Integration (LSI) chips. Minimizing the amount of isolation within a cell enhances density since isolation between components at least in part determines the minimum spacing between components and, therefore, the minimum size cell that can be achieved.

The need for isolation between many components is eliminated by using a PNP inverter transistor, T1, fabricated in an N epitaxial bed that is common to P resistors R1 and R2. The N epitaxial bed also forms the N cathode terminal of logic Schottky diodes D1, D2, D3 and of anti-saturation clamp diode D4. Anti-saturation clamp diode D5 is integrated into transistor T2 which is the only device that must be isolated from the other cell components.

Circuit operation

With inputs D1, D2 and D3 at down levels, current flows from +V, through the base-collector junction of T1 and then through R1 into ground. Current also flows from the collector of T2, through anti-saturation clamp diode D4 and then through R1 into ground.

With down levels at the input nodes, input logic diodes D1, D2 and D3 are not forward biased enough to conduct. Current flowing through the emitter-base junction of T1 turns T1 on, producing an up level at the output node (Z) with abundant current drive capability. The voltage across the base-emitter junction of T2 is insufficient to turn T2 fully on, although T2 does remain partially on, performing as an active collector load for T1 with conduction controlled by emitter resistor R2.

With inputs D1, D2 or D3 at an up level, current flows through D1, D2 or D3, depending on which input or inputs are up. The common cathode node of D1, D2 and D3 is pulled up producing a current flow from the input diode or diodes into the base-emitter junction of T2 and also through anti-saturation clamp diode D5 into the collector of T2 and then from the emitter of T2 through R2 into ground. Current also flows from the common cathode node of D1, D2 and D3 through R1 into ground. With an input or inputs up, the voltage across the base-emitter junction of T1 is insufficient to turn T1 on. Current flowing in the base-emitter junction of T2 turns T2 on producing a down level at the output node (Z). The function of emitter resistor R2 is to limit current flowing in the emitter circuit of T2 and to increase the DC input impedance of the circuit, thus avoiding current hogging of driving circuits.

Transient Operation

Capacitor C1 provides a low impedance shunt path across R2 for a signal transition appearing at the circuit input or inputs. This low impedance path produces faster switching speed by allowing higher current to flow in the emitter of T2 during turn on and by retaining a charge on the emitter of T2 that is more positive than ground during turn off.

Summary of Features of the High Speed Complementary NOR

Components T1, D1, D2, D3, D4, R1 and R2 are all in a common subcollector bed.—Reduced cell size.

The common subcollector bed is also the cathode terminal for diodes D1, D2, D3 and D4—Reduced process steps.

Capacitor C1 enhances performance.—Enhances switching speed.

Push-Pull operation allows driving highly capacitive loads.—Enhances utility of circuit.

FIGS. 2 and 3 show a masterslice cell layout of a logic circuit in accordance with invention. All components of this circuit except transistor T2, diode D5 and capacitor C1 share a common isolated region thus greatly reducing the cell area. Metal interconnections for this circuit are shown. Capacitor C1 is formed by the oversize metal contact to resistor R2.

Figure 3A:
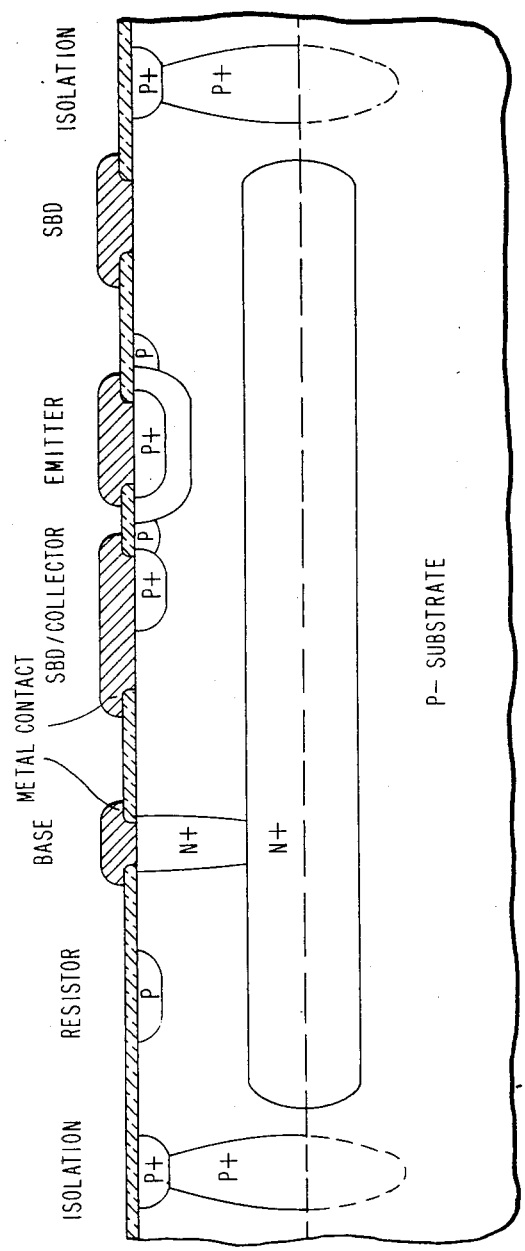
FIG. 3A is, in accordance with the invention, a cross-sectional view through the line 3A—3A of the cell structure of FIG. 3.

FIG. 3A shows a chip cross sectional view along the line 3A—3A of the cell of FIG. 3. This graphically shows how the circuit components are contained within the isolated region.

While the invention has been particularly shown and described with reference to preferred embodiments thereof, it will be understood by those skilled in the art that various changes in form and detail may be made without departing from the spirit and scope of the invention.

What is claimed is:

1. A logic circuit for accepting at least first, second and third binary inputs and providing a logical binary output which is a predetermined logical function of said first, second and third binary inputs, said predetermined logical function being one of the following logical functions, "NOR" or "NAND", said logic circuit comprising:

first, second and third input terminals for respectively each receiving one of said first, second and third binary inputs;

a PNP transistor having an emitter, base and collector, said emitter of said PNP transistor connector to a first source of potential;

a NPN transistor having an emitter, base and collector, said collector of said NPN transistor directly connected to said collector of said PNP transistor;

a first resistor connected between said emitter of said NPN transistor and a second source of potential;

a capacitor connected in parallel with said first resistor;

a second resistor connected between said base of said NPN transistor and said second source of potential first, second and third low voltage (300 mv.) Schottky barrier diodes, each of said first second and third Schottky barrier diodes having an anode and a cathode, said anodes of said first, second and third Schottky barrier diodes respectively connected to one of said first, second and third input terminals, and said cathodes of said first, second and third Schottky barrier diodes connected in common to said base of said PNP transistor and said base of said NPN transistor;

a fourth low voltage (300 mv.) Schottky barrier diode, said fourth low voltage Schottky barrier diode having an anode and a cathode, said anode of said fourth Schottky barrier diode connected to said base of said NPN transistor and said cathode of said fourth Schottky barrier diode connected to said collector of said NPN transistor;

a high voltage (600 mv.) Schottky barrier diode, said high voltage Schottky barrier diode having an anode and a cathode, said anode of said high voltage Schottky barrier diode connected to said collector of said PNP transistor and said cathode of said high voltage Schottky barrier diode connected to said base of said PNP transistor; and an output terminal connected to said common connection of said collector of said NPN transistor and said collector of said PNP transistor, said output terminal providing a binary output which is a predetermined logical function of said first, second and third binary inputs.

* * * * *